United States Patent
Lin et al.

(10) Patent No.: US 8,334,549 B2
(45) Date of Patent: Dec. 18, 2012

(54) LIGHT EMITTING DIODE WITH CURRENT BLOCKING REGION

(75) Inventors: Mong-Ea Lin, Hsinchu (TW); Yao-Hui Lin, Hsinchu (TW); Chao-Ming Chiu, Hsinchu (TW); Chang-Ming Lu, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 27 days.

(21) Appl. No.: 13/029,677

(22) Filed: Feb. 17, 2011

(65) Prior Publication Data
US 2012/0037952 A1 Feb. 16, 2012

(30) Foreign Application Priority Data
Aug. 13, 2010 (TW) .............................. 99127201 A

(51) Int. Cl.
*H01L 33/30* (2010.01)
(52) U.S. Cl. ................. 257/103; 257/E33.023
(58) Field of Classification Search .................. 257/103, 257/E33.023, E33.062, 13, 79, 82, 85, 86, 257/90, 94, 97, 98, E33.011, E33.001, E21.021, 257/E33.054, E25.028, E25.032, E33.034, 257/E33.3
See application file for complete search history.

(56) References Cited

U.S. PATENT DOCUMENTS

| | | | | |
|---|---|---|---|---|
| 6,583,443 | B1 * | 6/2003 | Chang et al. ..................... | 257/79 |
| 2007/0145391 | A1 * | 6/2007 | Baik et al. ....................... | 257/94 |

* cited by examiner

*Primary Examiner* — Victor A Mandala
*Assistant Examiner* — Selim Ahmed
(74) *Attorney, Agent, or Firm* — WPAT, P.C.; Anthony King

(57) ABSTRACT

A light emitting diode and a fabricating method thereof are provided. A first-type semiconductor layer, a light emitting layer and a second-type semiconductor layer with a first surface are sequentially formed a substrate. Next, the first surface is treated during a surface treatment process to form a current-blocking region which extends from the first surface to the light emitting layer to a depth of 1000 angstroms. Afterward, a first electrode is formed above the current-blocking region of the second-type semiconductor layer, and a second electrode is formed to electrically contact to the first-type semiconductor layer. Since the current-blocking region is formed with a determined depth within the second-type semiconductor layer, the light extraction efficiency of the light emitting diode may be increased.

15 Claims, 7 Drawing Sheets

LIGHT EMITTING DIODE WITH CURRENT BLOCKING REGION

FIELD OF THE INVENTION

The present invention generally relates to a light emitting element and a fabricating method thereof, and more particularly relates to a light emitting diode and a fabricating method thereof.

BACKGROUND OF THE INVENTION

Compared with a conventional bulb, the light emitting diode (LED) has outstanding advantages, such as compact, long-life, low driving voltage/current, cracking resistance, no obvious thermal problem when lighting, mercury free (no pollution problem), high lighting efficiency (power saving), etc. In addition, the lighting efficiency of LEDs has been continuously improved in recent years. Hence, LEDs have gradually replaced fluorescent lamps and incandescent lamps in some fields, such as the scanner light source, the back or front light source of the liquid crystal display, the illumination for the instrument panel of automobile, the traffic signal lamps and the general lighting devices.

FIG. 1 is a cross sectional view showing a conventional light emitting diode. Referring to FIG. 1, a light emitting diode 100 mainly consists of a substrate 110, a N-type semiconductor layer 120, an electrode 130, a light emitting layer 140, a P-type semiconductor layer 150, a current-blocking layer 160, an electrode 170 and a current spreading layer 180. The N-type semiconductor layer 120, the light emitting layer 140, the P-type semiconductor layer 150, the current spreading layer 180, and the electrode 170 are sequentially formed on the substrate 110. In the conventional technique, to prevent light emitted by the portion of the light emitting layer 140 corresponding to the electrode 170 from being adsorbed or reflected by the electrode 170, a current-blocking layer 160 made of insulation material is formed between the P-type semiconductor layer 150 and the current spreading layer 180 and opposite to the electrode 170. In addition, the light emitting layer 140 only covers a portion of the N-type semiconductor layer 120, and the electrode 130 is disposed on a portion of the N-type semiconductor layer 120 that is not covered by the light emitting layer 140.

Referring also to FIG. 1, when an external circuit provides a voltage to the electrode 130 and the electrode 170, the current spreading layer 180 spreads a current C to two sides of the current-blocking layer 160 and conducts the current into the P-type semiconductor layer 150 such that the P-type semiconductor layer 150 provides electric holes to the light emitting layer 140. The electric holes and the electrons provided by the N-type semiconductor layer 120 are combined so as to emit the light. Simultaneously, because there is no current conducted into the portion of the P-type semiconductor layer 150 that is covered by the current-blocking layer 160, the portion of the P-type semiconductor layer 150 covered by the current-blocking layer 160 cannot provide electric holes to the light emitting layer 140. Accordingly, the portion of the light emitting layer 140 corresponding to the current-blocking layer 160 doesn't emit light.

As described above, the conventional light emitting diode 100 utilizes the current-blocking layer 160 to prevent the current under the electrode 170 from being conducted into the P-type semiconductor layer 150. As a result, the light can be emitted from the portion of the P-type semiconductor layer 150 which is not covered by the electrode 170. Accordingly, the light extraction efficiency of the light emitting diode 100 is improved. However, the current-blocking layer 160 consisting of the insulation material easily increases the electrical resistance between the current spreading layer 180 and the P-type semiconductor layer 150 and increases the forward voltage of the light emitting diode 100, so a life time of the light emitting diode 100 is decreased.

In addition, the binding force between the current spreading layer 180 and the P-type semiconductor layer 150 are also decreased because the step coverage between the current spreading layer 180 and the current-blocking layer 160. As a result, the light emitting diode 100 is easily damaged in the following wire bonding process due to having poor structure strength.

SUMMARY OF THE INVENTION

The present invention provides a light emitting diode having improved light extraction efficiency.

The present invention provides a fabricating method of light emitting diode for improving the light extraction efficiency without decreasing the structure strength of the light emitting diode.

In one embodiment, the present invention provides a light emitting diode which includes a first type semiconductor layer, a light emitting layer, a second type semiconductor layer, a first electrode, and a second electrode. The light emitting layer is disposed on the first type semiconductor layer. The second type semiconductor layer is disposed on the light emitting layer and has a first surface and a current-blocking region. The depth of the current-blocking region in the direction from the first surface towards the light emitting layer is less than or equal to 1000 angstroms. The first electrode is disposed above the current-blocking region of the second type semiconductor layer. The second electrode is electrically contacted to the first type semiconductor layer.

In one embodiment, the light emitting diode further includes a substrate. The first type semiconductor layer is disposed on the substrate, and a portion of the first type semiconductor layer is covered by the light emitting layer. The second electrode is disposed on a portion of the first type semiconductor layer that is not covered by the light emitting layer.

In one embodiment, the current-blocking region is an oxide layer. For example, material of the oxide layer can include indium gallium oxynitride.

In one embodiment, the current-blocking region is an opening formed in a surface of the second type semiconductor layer.

In one embodiment, the depth of the current-blocking region is less than or equal to 700 angstroms.

In one embodiment, the first type semiconductor layer is disposed between the second electrode and the light emitting layer.

In one embodiment, the light emitting diode further includes a current spreading layer disposed between the second type semiconductor layer and the first electrode and covering the second type semiconductor layer.

In one embodiment, material of the current-blocking layer includes transparent conductive material.

In one embodiment, material of the first type semiconductor layer, the light emitting layer, and the second type semiconductor layer include III-V compound semiconductor material.

In one embodiment, the present invention also provides a fabricating method of light emitting diode. The fabricating method includes following steps. A substrate is provided, and a first type semiconductor layer, a light emitting layer, and a second type semiconductor layer are sequentially formed on the substrate. The second type semiconductor layer has a first surface. Then, a surface treatment process is performed on a portion of the first surface of the second type semiconductor layer to form a current-blocking region. The depth of the current-blocking layer extending in a direction from the first surface towards the light emitting layer is less than or equal to 1000 angstroms. After that, a first electrode is formed on the current-blocking region of the second type semiconductor layer, and a second electrode electrically contacted to the first type semiconductor layer is also formed.

In one embodiment, the surface treatment process includes an inductively coupled plasma etching process, an oxidization process, a chlorination process, or a wet etching process.

In one embodiment, the oxidization process includes oxidizing the portion of the first surface of the second type semiconductor layer by using plasma containing nitrogen oxide or oxygen.

In one embodiment, the wet etching process includes etching the portion of the first surface of the second type semiconductor layer by using an etchant containing phosphoric acid.

In one embodiment, the fabricating method further includes stripping the substrate to expose a second surface of the first type semiconductor layer before forming the second electrode. The second surface is opposite to the light emitting layer, and the second electrode is formed on the second surface.

In one embodiment, the fabricating method further includes removing a portion of the second type semiconductor layer and the light emitting layer to expose a portion of the first type semiconductor layer. Then, the second electrode is formed on the exposed portion of the first type semiconductor layer.

In one embodiment, the fabricating method further includes forming a current spreading layer on the second type semiconductor layer before forming the first electrode.

In one embodiment, before performing the surface treatment process, the fabricating method further includes forming a mask layer on the second type semiconductor layer and removing a portion of the mask layer to expose a portion of the second type semiconductor layer, so as to form the current-blocking layer.

In the light emitting diode of the present invention, the current-blocking layer is formed in the second type semiconductor layer to decrease carriers to be conducted into the light emitting layer from an area right below the first electrode. As such, the effective light emitting area of the light emitting layer can be prevented from being concentrated in the area right below the first electrode, and thus, the light extraction efficiency of the light emitting diode is improved. In addition, because the maximum depth of the current-blocking region is 1000 angstroms and is far less than the thickness of the second type semiconductor layer, the portion of the second type semiconductor layer below the current-blocking region is still capable of providing carriers to the light emitting layer. Accordingly, the luminous intensity of the light emitting diode is further improved.

BRIEF DESCRIPTION OF THE DRAWINGS

The above objects and advantages of the present invention will v after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The two electrodes of the light emitting diode of the present invention can be located in the same side or opposite sides, which will be described in detail with reference to embodiments as follows.

Figure 1:
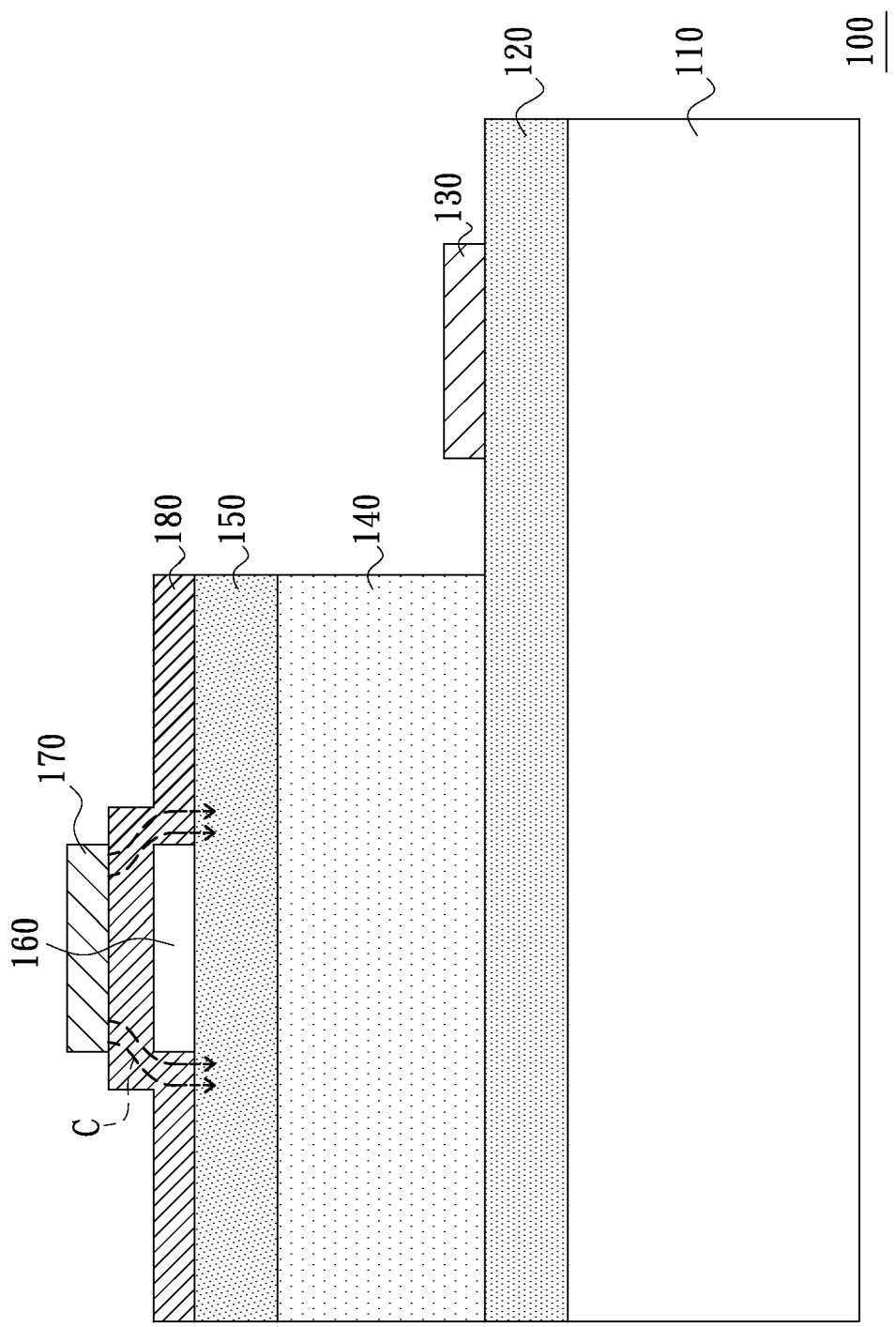
FIG. 1 is a cross sectional schematic view of a conventional light emitting diode.
Figure 2A:
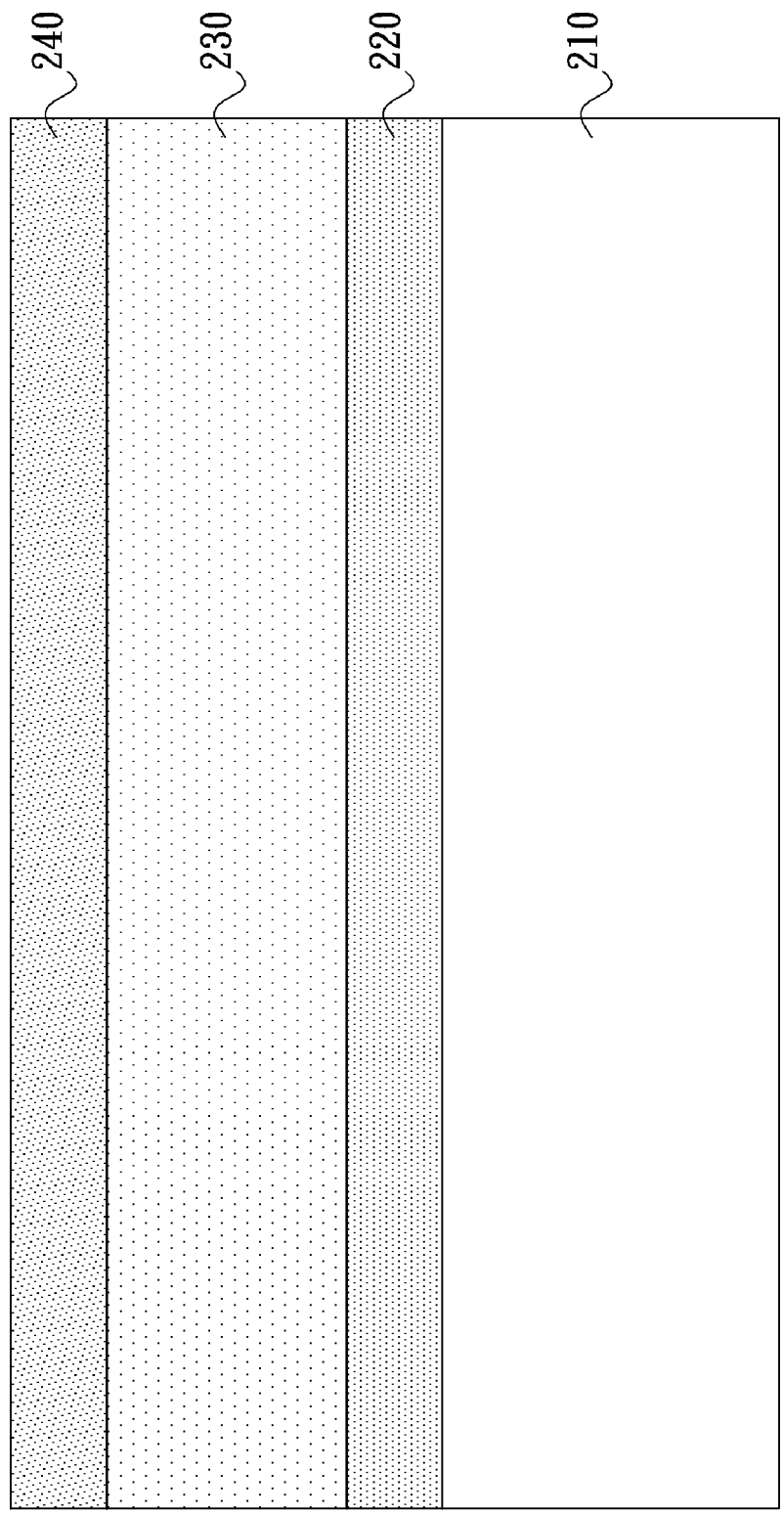
FIGS. 2A to 2C are cross sectional schematic views showing a light emitting diode at different steps of a fabricating method according to an embodiment of the present invention.
Figure 2B:
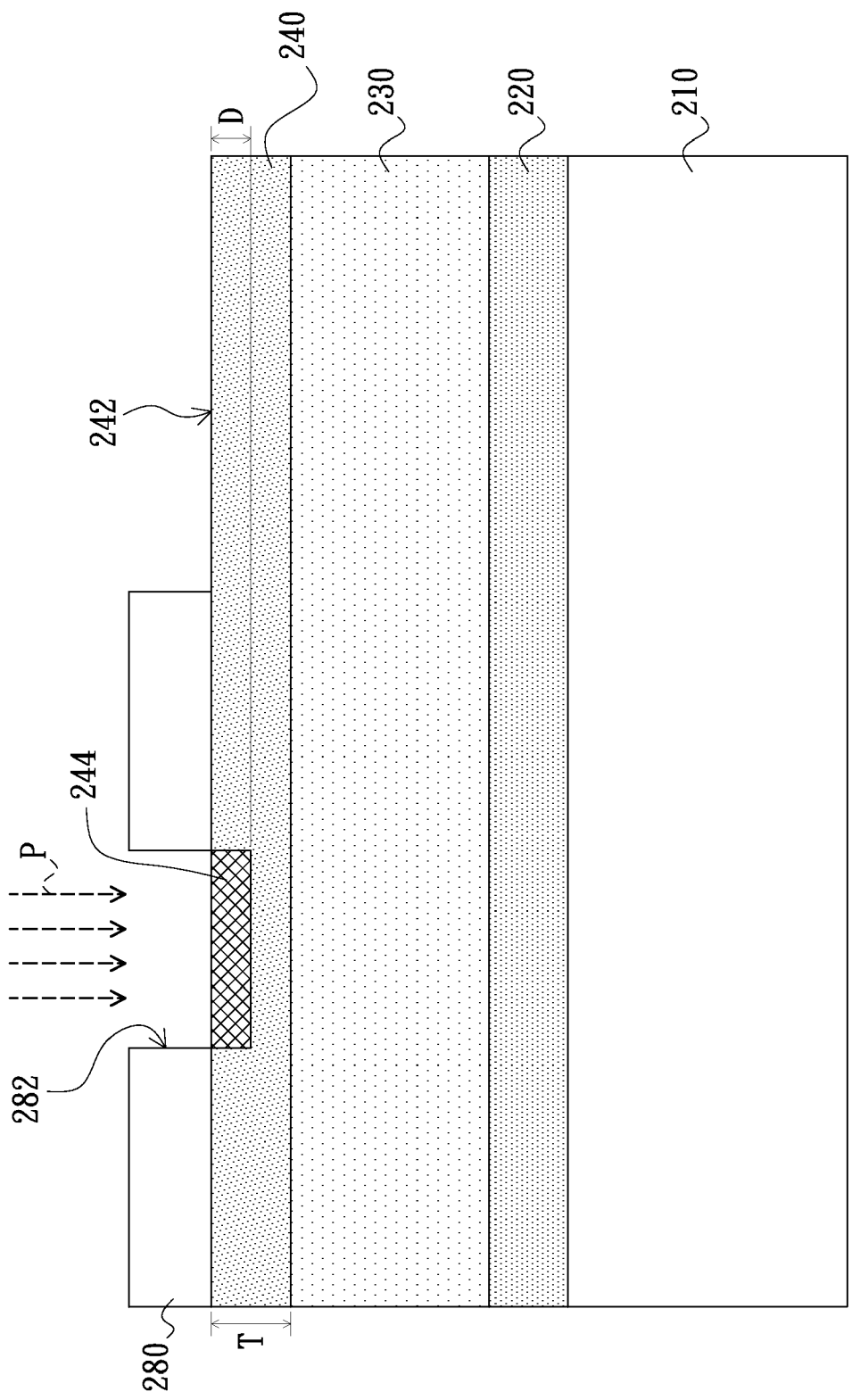
Figure 2C:
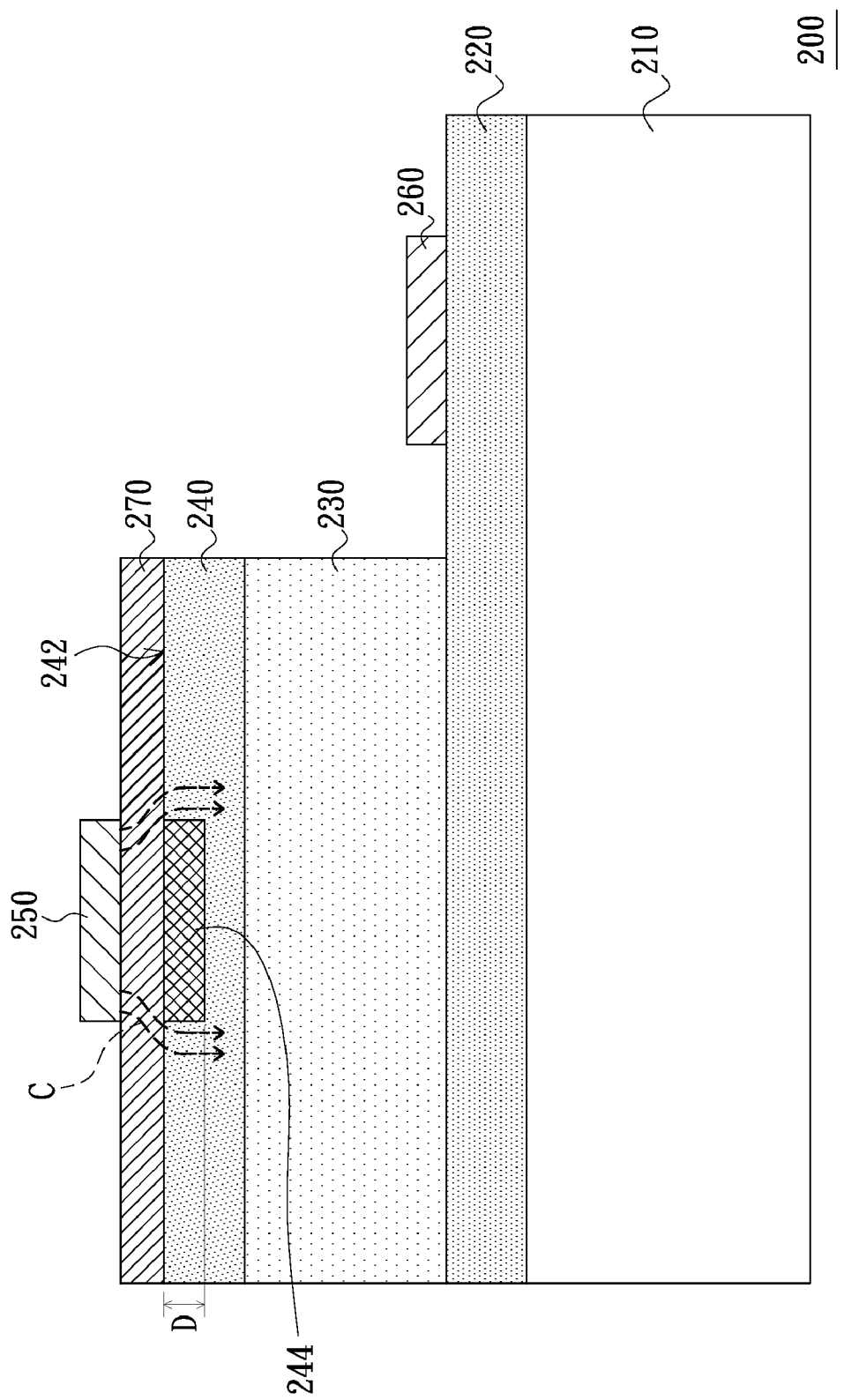

FIGS. 2A to 2C are cross sectional schematic views illustrating different steps of a fabricating method according to an embodiment of the present invention. Referring to FIG. 2A, firstly, a first type semiconductor layer 220, a light emitting layer 230, and a second type semiconductor layer 240 are sequentially formed to be stacked on a substrate 210. In the present embodiment, the first type semiconductor layer 220, for example, is a P-type semiconductor layer, and the second type semiconductor layer 240, for example, is an N-type semiconductor layer. However, the present invention is not limited as above example. In other embodiments, the first type semiconductor layer 220 can also be N-type semiconductor layer, and the second type semiconductor layer 240 can also be P-type semiconductor layer. The first type semiconductor layer 220, the light emitting layer 230 and the second type semiconductor layer 240 of the present embodiment, for example, consist of III-V compound semiconductor material. For example, the first type semiconductor layer 220 consists of P-type doped gallium nitride, the light emitting layer 230 consists of a quantum well structure mainly composed of III-V group elements such as, gallium nitride, gallium arsenide, gallium phosphide, gallium arsenide phosphide, aluminum nitride or indium nitride. The second type semiconductor layer 240 consists of N-type doped gallium nitride.

Referring to FIG. 2B, a surface treatment process is performed on a portion of a first surface 242 of the second type semiconductor layer 240 to form a current-blocking region 244. The depth D of the current-blocking region extending in a direction from the first surface 242 towards the light emitting layer 230 is far less than the thickness T of the second type semiconductor layer 240, and the maximum depth D of the current-blocking region 244 is 1000 angstroms. It is noted that the scale of the depth D is amplified in FIG. 2B for the purpose of clearness, and this scale can't be used to limit the scope of the present invention.

In addition, before performing the surface treatment process, a mask layer 280 can be formed on the second type semiconductor layer 240. The mask layer 280 has an opening 282 exposing the portion of the first surface 242 for the surface treatment process. However, this step can also be omitted.

The surface treatment process, for example, is an oxidization process for oxidizing the portion of the first surface 242 of the second type semiconductor layer 240. In other words, the current-blocking region 244 of the present embodiment is an electrically insulating oxide layer. Specifically, the present embodiment utilizes plasma containing nitrogen oxide ($N_2O$) or oxygen to perform plasma-enhanced chemical vapor deposition (PECVD), chemical vapor deposition (CVD), low pressure plasma-enhanced chemical vapor deposition (LPCVD), high density plasma chemical vapor deposition (HDPCVD), reactive ion etching (RIE), inductively coupled plasma (ICP) etching, or electron cyclotron resonance (ECR) etching to oxidize the portion of the first surface 242, thereby forming the current-blocking region 244 consisting of indium gallium oxynitride.

It is worthy to note that in another embodiment of the present invention, the surface treatment process can also be a chlorination process which utilizes the reaction between chlorine and the gallium nitride in the portion of the first surface 242 to form gallium chloride and nitrogen. Then, the nitrogen is vented and a nitride-vacancy current-blocking region 244 is obtained. In other words, the current-blocking region 244 consists of gallium chloride.

As shown in FIG. 2C, a portion of the light emitting layer 230 and a portion of the second type semiconductor layer 240 are removed to expose a portion of the first type semiconductor layer 220, and then a second electrode 260 is formed on the exposed portion of the first type semiconductor layer 220. After that, a first electrode 250 is formed above the current-blocking region 244 of the second type semiconductor layer 240. The first electrode 250 and the second electrode 260, for example, consist of gold, chromium, platinum, titanium, aluminum, iridium, rhodium, or other metal material having high electrical conductivity.

In the present embodiment, a current spreading layer 270 can be formed on the second type semiconductor layer 240 before forming the first electrode 250. The current spreading layer 270, for example, consists of transparent conductive material such as indium tin oxide (ITO), or indium zinc oxide (IZO). However, the material of the current spreading layer 270 is not limited as above examples. After that, the first electrode 250 is formed on the current spreading layer 270, and the first electrode 250 is corresponded to the current-blocking region 244. After above steps, the light emitting diode 200 is substantially fabricated.

It is noted that the sequence of forming the first electrode 250 and the second electrode 260 is not limited in any order. In other embodiments, the second electrode 260 can also be formed after the first electrode 250 is formed.

To make those ordinarily skilled in the art a better understanding of the present invention, the structure of the light emitting diode of above embodiment will be described as follows. Referring again to FIG. 2C, the light emitting diode 200 includes the first type semiconductor layer 220, the light emitting layer 230, the second type semiconductor layer 240, the first electrode 250 and the second electrode 260. The light emitting layer 230 is disposed on the first type semiconductor layer 220, and the second type semiconductor layer 240 is disposed on the light emitting layer 230 and has the first surface 242 and the current-blocking region 244. The current-blocking region 244 extends from the first surface 242 towards the light emitting layer 230 at the depth D. The maximum value of D is 1000 angstroms, and preferably is 700 angstroms. The first electrode 250 is disposed above the current-blocking region 244.

In addition, the light emitting diode 200 of the present embodiment can also include the substrate 210. The first type semiconductor layer 220 is disposed on the substrate 210, a portion of the first type semiconductor layer 220 is covered by the light emitting layer 230, and the second electrode 260 is disposed on the portion of the first type semiconductor layer that is not covered by the light emitting layer. In other words, the first electrode 250 and the second electrode 260 of the light emitting diode 200 of the present embodiment are located at the same side of the substrate 210. The light emitting diode 200 can also include the current spreading layer 270 disposed between the second type semiconductor layer 240 and the first electrode 250.

When a voltage difference is applied between the first electrode 250 and the second electrode 260, a current C is conducted into the second type semiconductor layer 240 from the first electrode 250. The current C drives the second type semiconductor layer 240 to provide carriers to the light emitting layer 230, and thereby the current C is spread to the periphery of the current-blocking region 244. At this time, because the current-blocking region 244 consists of the electrically insulating oxide, the current will be conducted into the second type semiconductor layer 240 from the periphery of the current-blocking region 244. As a result, the effective light emitting area is not concentrated below the first electrode 250, so the light extraction efficiency is improved.

Additionally, as described above, in another embodiment, the current-blocking region 244 can also be the nitride-vacancy current-blocking region, which is formed by performing the chlorination process on the portion of the first surface 242 of the second type semiconductor layer, to decrease the carrier concentration of the current-blocking region 244. This can prevent the effective light emitting area from being concentrated below the first electrode 250, and thus the light extraction efficiency can also be improved.

Specially, because the maximum depth D of the current-blocking region 244 is 1000 angstroms, the portion of the second type semiconductor layer 240 below the current-blocking region 244 is still capable of providing carries to the light emitting layer 230 after the current is conducted into the second type semiconductor layer 240. Thus, the light emitting diode 200 of the present invention has high light extraction efficiency and high luminous intensity.

Except the examples of the surface treatment process listed above, other embodiments of the present invention can also utilize other methods to form the current-blocking region 244 in the portion of the first surface 242 of the second type semiconductor layer 240. More examples will be described as follows. However, it is understood that the surface treatment process is not limited to above and the following examples.

Figure 3:
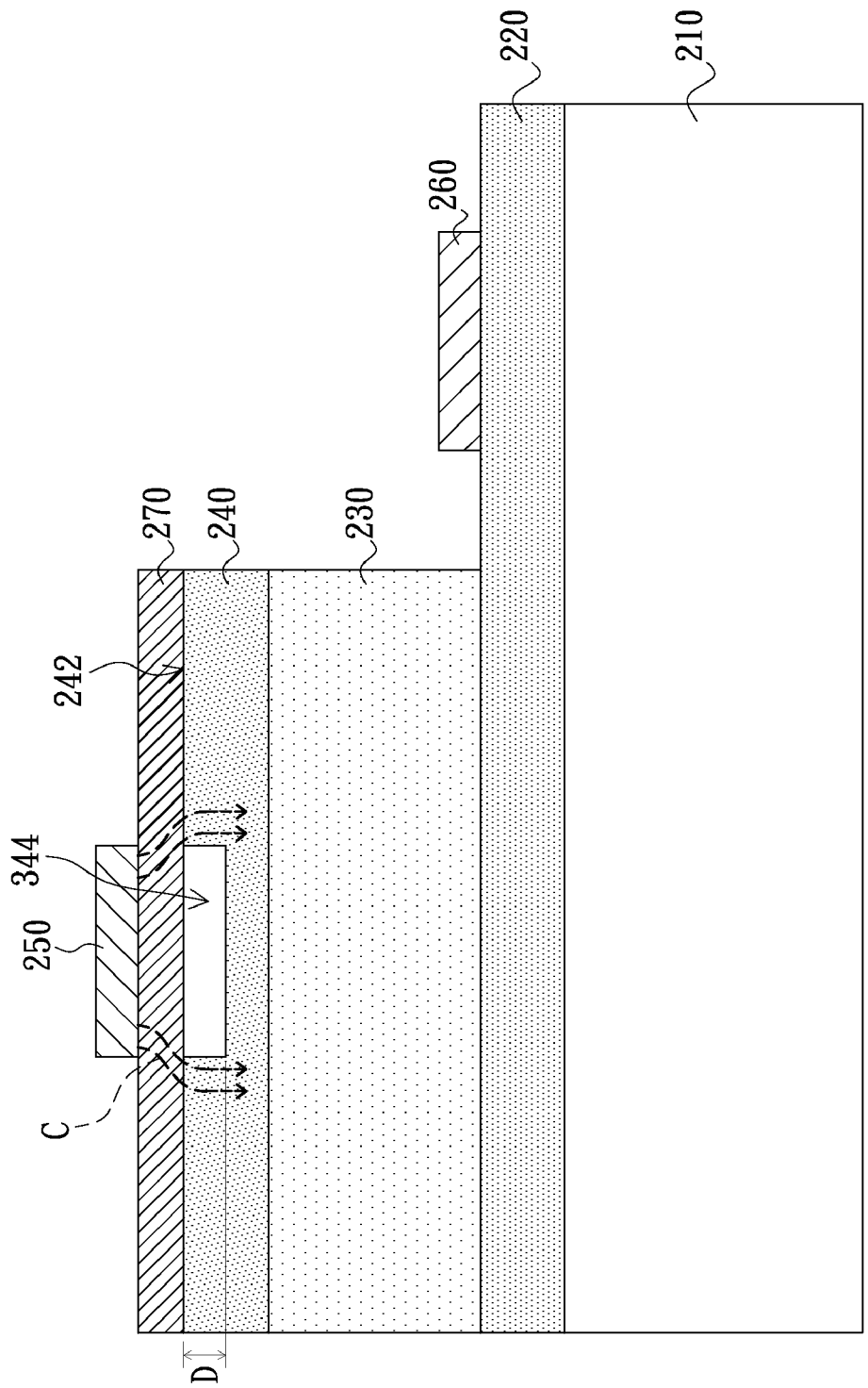
FIG. 3 is a cross sectional schematic view showing a light emitting diode during a fabricating step according to another embodiment.

FIG. 3 is a cross sectional schematic view showing a light emitting diode during a fabricating step according to another embodiment. Referring to FIG. 3, the surface treatment process of the present embodiment can include performing a dry etching such as an isotropic inductively coupled plasma etching on the portion of the first surface 242 to form an opening 344. The opening 344 can be served as the current-blocking region. In another embodiment, the surface treatment process can also include performing a wet etching such as anisotropic wet etching on the first surface 242 of the second type semiconductor layer to form the opening 344. For example, the wet etching can utilize an etchant containing phosphoric acid.

The second type semiconductor layer 240 usually includes a layer of magnesium for decreasing the electrical resistance. In the present embodiment, the etching process is used to etch the magnesium on the portion of the first surface 242 of the second type semiconductor layer 240 to form the opening 344. As such, the contact resistance between the first electrode 250 formed above the opening 344 and the second type semiconductor layer 240 is improved, so the current from the first electrode 250 is conducted into the second type semiconductor layer 240 via the periphery of the opening 344. Similarly, the scale of the depth D of the opening 344 is also amplified for purpose of clearness, and this scale can't be used to limit the scope of the present invention.

It is worthy to note that the first electrode 250 and the second electrode 260 of the light emitting diode 200 are located at the same side of the first type semiconductor layer 220. However, the present invention is not limited to the above manner. Another configuration of the two electrodes will be described together with embodiments and figures as follows.

Figure 4A:
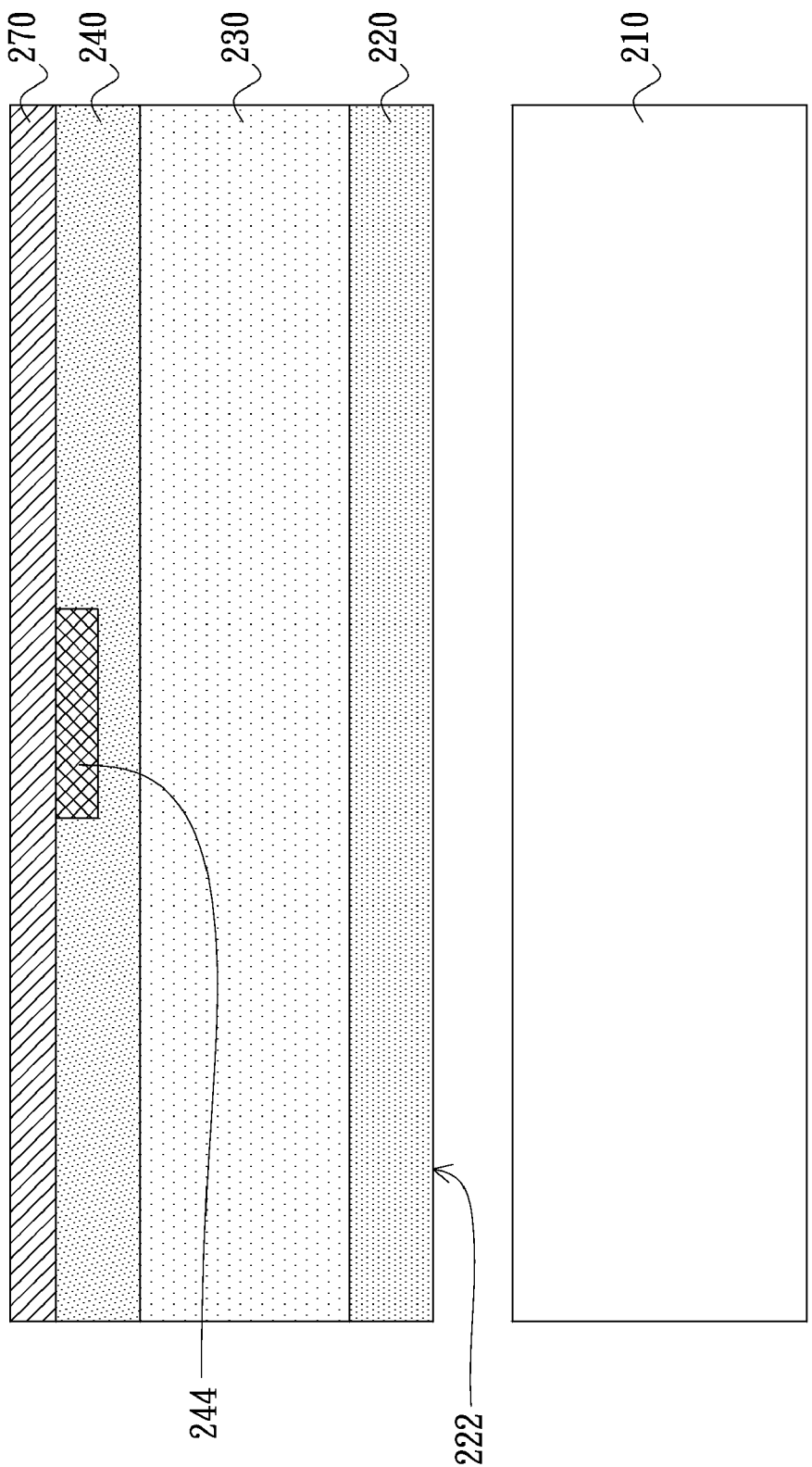
FIGS. 4A and 4B are cross sectional schematic views showing a light emitting diode during fabricating steps according to still another embodiment.
Figure 4B:
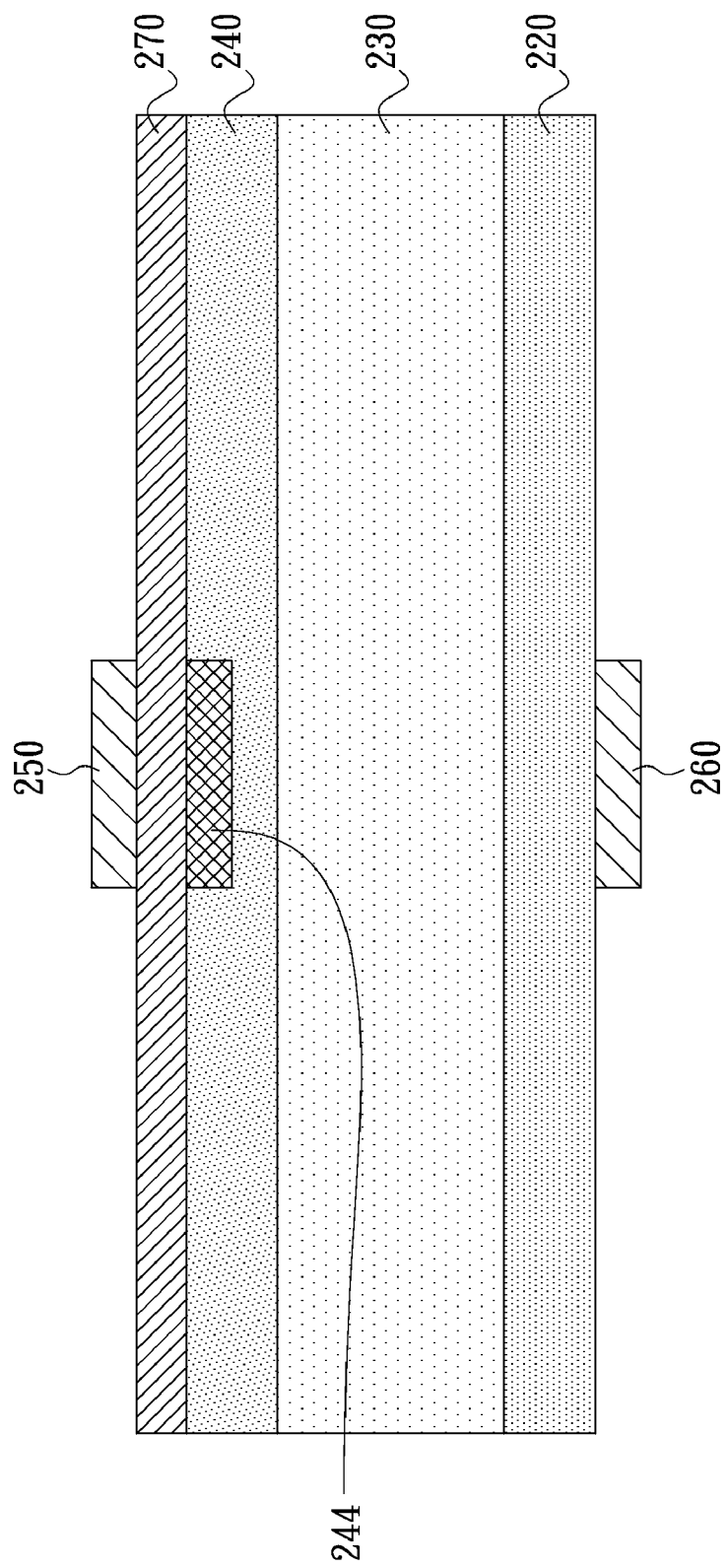

FIGS. 4A and 4B are cross sectional schematic views showing a light emitting diode during fabricating steps according to still another embodiment. Referring to FIG. 4A, in the present embodiment, before forming the second electrode 260, the substrate 210 and the first type semiconductor layer 220 are separated to expose a second surface 222 of the first type semiconductor layer 220, and the second surface 222 is opposite to the light emitting layer 230. After that, as shown in FIG. 4B, the second electrode 260 is formed on the second surface 222. In other words, the first type semiconductor layer 220 is disposed between the light emitting layer 230 and the second electrode 260.

Similarly, the formation of the first electrode 250 and the second electrode 260 are also not limited in any order. As described above, the first electrode 250 and the second electrode 260 of light emitting diode 400 of the present invention are located at different sides of the light emitting layer 230.

In summary, the light emitting diode of the present invention utilizes the current-blocking region formed in the second type semiconductor layer to make the carriers provided by the second type semiconductor layer be conducted into the light emitting layer from the periphery of the current-blocking region. Then, the carriers provided by the second type semiconductor layer and the carriers provided by the first type semiconductor layer are combined to emit the light. Thus, the effective light emitting area is not concentrated below the first electrode, so the light emitted by the light emitting layer is emitted out from the portion of the light emitting layer that is not under the first electrode. Accordingly, the light extraction efficiency of the light emitting diode is further improved.

In addition, the current spreading layer is directly formed on the second type semiconductor layer of the light emitting diode of the present invention, the binding force between the current spreading layer and the second type semiconductor layer is strong. This prevents the current spreading layer from being peeled off by external force during the following processes. Therefore, the forward voltage of the light emitting diode is not increased, so the lifetime of the light emitting diode is also increased.

Additionally, because the maximum depth of the current-blocking region is 1000 angstroms, which is far less than the thickness of the second type semiconductor layer. Therefore, the portion of the second type semiconductor layer below the current-blocking region is still capable of providing carriers to the light emitting layer to be combined with the carriers provided by the first type semiconductor layer to emit light. Accordingly, the luminous intensity of the light emitting diode is further improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A light emitting diode, comprising:
a first type semiconductor layer;
a light emitting layer disposed on the first type semiconductor layer;
a second type semiconductor layer disposed on the light emitting layer, the second type semiconductor layer having a first surface and a current-blocking region, the current-blocking region extending in a direction from the first surface towards the light emitting layer at a depth less than or equal to 1000 angstroms;
a first electrode disposed above the current-blocking region of the second type semiconductor layer; and
a second electrode electrically contacted to the first type semiconductor layer,
wherein the current-blocking region is an oxide layer of the second type semiconductor, an chloride layer of the second type semiconductor, or an opening formed in the first surface of the second type semiconductor layer.

2. The light emitting diode of claim 1, further comprising a substrate, wherein the first type semiconductor layer is disposed on the substrate, a portion of the first type semiconductor layer is covered by the light emitting layer, and the second electrode is disposed on a portion of the first type semiconductor layer that is not covered by the light emitting layer.

3. The light emitting diode of claim 1, wherein material of the oxide layer of the second type semiconductor comprises indium gallium oxynitride.

4. The light emitting diode of claim 1, wherein the depth is less than or equal to 700 angstroms.

5. The light emitting diode of claim 1, wherein the first type semiconductor layer is disposed between the second electrode and the light emitting layer.

6. The light emitting diode of claim 1, further comprising a current spreading layer disposed between the second type semiconductor layer and the first electrode and covering the second type semiconductor layer.

7. The light emitting diode of claim 6, wherein material of the current spreading layer comprises transparent conductive material.

8. The light emitting diode of claim 1, wherein material of the first type semiconductor layer, the light emitting layer, and the second type semiconductor layer comprise III-V compound semiconductor material.

9. A light emitting diode, comprising:
a first type semiconductor layer;
a light emitting layer disposed on the first type semiconductor layer;
a second type semiconductor layer disposed on the light emitting layer, the second type semiconductor layer having a first surface and a current-blocking region, the current-blocking region extending in a direction from the first surface towards the light emitting layer at a depth less than or equal to 1000 angstroms;
a first electrode disposed above the current-blocking region of the second type semiconductor layer; and
a second electrode electrically contacted to the first type semiconductor layer,
wherein the current-blocking region is an oxide layer, material of the oxide layer comprises indium gallium oxynitride.

10. The light emitting diode of claim 9, further comprising a substrate, wherein the first type semiconductor layer is disposed on the substrate, a portion of the first type semiconductor layer is covered by the light emitting layer, and the second electrode is disposed on a portion of the first type semiconductor layer that is not covered by the light emitting layer.

11. The light emitting diode of claim 9, wherein the depth is less than or equal to 700 angstroms.

12. The light emitting diode of claim 9, wherein the first type semiconductor layer is disposed between the second electrode and the light emitting layer.

13. The light emitting diode of claim 9, further comprising a current spreading layer disposed between the second type semiconductor layer and the first electrode and covering the second type semiconductor layer.

14. The light emitting diode of claim 13, wherein material of the current spreading layer comprises transparent conductive material.

15. The light emitting diode of claim 9, wherein material of the first type semiconductor layer, the light emitting layer, and the second type semiconductor layer comprise III-V compound semiconductor material.

* * * * *